United States Patent [19]
McMillin et al.

[11] Patent Number: 5,835,334
[45] Date of Patent: Nov. 10, 1998

[54] VARIABLE HIGH TEMPERATURE CHUCK FOR HIGH DENSITY PLASMA CHEMICAL VAPOR DEPOSITION

[75] Inventors: Brian McMillin, Fremont; Michael Barnes, San Francisco; Butch Berney, Pleasanton; Huong Nguyen, Danville, all of Calif.

[73] Assignee: Lam Research, Fremont, Calif.

[21] Appl. No.: 724,005

[22] Filed: Sep. 30, 1996

[51] Int. Cl.⁶ .................................................. H02N 13/00
[52] U.S. Cl. .......................................... 361/234; 279/128
[58] Field of Search .................................... 361/234, 233; 279/128

[56] References Cited

U.S. PATENT DOCUMENTS

| | | | |
|---|---|---|---|
| 4,384,918 | 5/1983 | Abe . | |
| 4,771,730 | 9/1988 | Tezuka | 118/723 |
| 4,980,566 | 12/1990 | Heilweil | 250/339 |
| 5,055,964 | 10/1991 | Logan et al. | 361/234 |
| 5,078,851 | 1/1992 | Nishihata et al. | 156/345 |
| 5,111,032 | 5/1992 | Batliwalla et al. | 219/549 |
| 5,134,436 | 7/1992 | Fujioka | 355/30 |
| 5,155,652 | 10/1992 | Logan et al. . | |
| 5,166,856 | 11/1992 | Liporace et al. . | |
| 5,221,403 | 6/1993 | Nozawa et al. . | |
| 5,280,156 | 1/1994 | Nori et al. . | |
| 5,290,381 | 3/1994 | Nozawa et al. | 156/345 |
| 5,376,213 | 12/1994 | Ueda et al. | 156/345 |
| 5,382,311 | 1/1995 | Ishikawa et al. | 156/345 |
| 5,413,360 | 5/1995 | Atari et al. . | |
| 5,436,790 | 7/1995 | Blake et al. | 361/234 |
| 5,567,267 | 10/1996 | Kazama et al. | 156/345 |
| 5,581,874 | 12/1996 | Aoki et al. | 361/234 |
| 5,584,971 | 12/1996 | Komino | 204/192.13 |
| 5,591,269 | 1/1997 | Arami et al. | 118/723 R |
| 5,609,720 | 3/1997 | Lenz et al. | 156/643.1 |
| 5,616,024 | 4/1997 | Nobori et al. | 432/241 |
| 5,625,526 | 4/1997 | Watanabe et al. | 361/234 |
| 5,660,740 | 8/1997 | Komino | 156/345 |
| 5,665,166 | 9/1997 | Deguchi et al. | 118/723 E |

FOREIGN PATENT DOCUMENTS

| | | |
|---|---|---|
| 0 411 916 | 2/1991 | European Pat. Off. . |
| 0 493 089 | 7/1992 | European Pat. Off. . |
| 0 498 752 | 8/1992 | European Pat. Off. . |
| 0 650 182 | 4/1995 | European Pat. Off. . |

OTHER PUBLICATIONS

GPI Web Client Abstract of Japan JP405175160A, Misuaki et al., Jul. 13, 1993.
Patent Abstract of Japan; vol. 018, No. 102 (E–1511), dated 18 Feb. 1994 & JP 05304116 A (Hitachi Ltd), 16 Nov. 1993.
Patent Abstract of Japan; vol. 096, No. 003, 29 Mar. 196 & JP 07 302785 A (Fujitsu Ltd.), 14 Nov. 1995.

Primary Examiner—Fritz Fleming
Attorney, Agent, or Firm—Pennie & Edmonds LLP

[57] ABSTRACT

An electrostatic chuck comprises an electrode cap with a dielectric layer for attracting and holding the back side of a semiconductor wafer positioned on the top surface of the dielectric layer, and a lower electrode. The electrostatic chuck is heated by resistive heating elements attached to or embedded within the chuck. The electrostatic chuck is cooled by circulating liquid coolant through the body of the chuck. Coolant gas is provided at the back side of the semiconductor wafer to improve thermal transfer. A feedback control mechanism maintains the chuck, and consequently the wafer, at a predetermined temperature by actively controlling both the heating and the cooling functions.

51 Claims, 4 Drawing Sheets

VARIABLE HIGH TEMPERATURE CHUCK FOR HIGH DENSITY PLASMA CHEMICAL VAPOR DEPOSITION

BACKGROUND OF THE INVENTION

1. Field of the Invention

The present invention relates to an electrostatic chuck (ESC) for holding a work object. More particularly, it relates to an electrostatic chuck with active temperature control, for holding and controlling the temperature of a semiconductor wafer during integrated circuit fabrication.

2. Description of the Prior Art

A number of different chucks are widely used to hold semiconductor wafers during processing. Mechanical chucks can secure the wafer by using arms or clamps to press the wafer against a supporting surface. The clamping force is inherently non-uniform, resulting in uneven stresses in the wafer which can cause deformation, and uneven thermal contact between the wafer and the support. Vacuum chucks secure the wafer by evacuating a void beneath the wafer backside, thereby generating a clamping force due to the pressure differential between the processing chamber and the wafer backside. Vacuum chucks can provide a more uniform clamping force than can mechanical chucks, but in the low pressure environments required for many semiconductor processing applications, the pressure differential is insufficient to generate an adequate clamping force.

Electrostatic chucks combine the advantages of the more uniform clamping ability of vacuum chucks and the usability in vacuum environments of mechanical chucks. In an electrostatic chuck (ESC), a voltage difference is applied between the wafer and a metallic electrode or pair of electrodes, the wafer and electrode(s) being separated by an interposed dielectric layer. The magnitude of the electrostatic clamping force thus generated depends on the applied voltage, the separation between the wafer and the electrode (s), and the dielectric constant of the interposed layer. As a result of their advantages over other chucking devices, ESCs have gained wide usage in the semiconductor processing industry.

In many semiconductor wafer processing applications it is desirable to control the temperature of the wafer during processing. Typical processes that benefit from an elevated and controlled wafer temperature include plasma enhanced chemical vapor deposition (CVD), etching, physical vapor deposition (PVD) and the like.

Electrostatic chucks incorporating means for heating the chuck are disclosed in the prior art. An example of a heated ESC is disclosed in Abe U.S. Pat. No. 4,384,918. Abe discloses a bipolar ESC with electrodes embedded in an insulating sheet. A voltage supplied between the two electrodes electrostatically chucks a semiconductor wafer placed on the top surface of the sheet. The insulating sheet is placed on a supporting base that can be configured with an electrical heater. The wafer is heated by conduction of heat from the heated supporting base through the electrode-containing insulating sheet. Alternatively, the base can be cooled by a water jacket.

The device in the '918 patent allows the base to be heated or, in a different configuration, to be cooled. The heating and cooling, however, cannot be effectively controlled. Poor and uneven thermal communication between the wafer and the insulating sheet, and between the insulating sheet and the heated base, and the absence of a means for combining the heating and cooling configurations render temperature control difficult to achieve.

Another heated ESC is disclosed in Logan U.S. Pat. No. 5,155,652. Logan discloses a method for temperature cycling a wafer during processing, using a stacked composite ESC assembly. Electrically insulating, thermally conductive layers are interspersed with layers having electrically conductive patterns. The layer assembly is bonded to a heat sinking base with cooling channels. One of the electrically conductive layers provides the two electrodes for the bipolar ESC clamping voltage, and another layer provides a resistive heating element. These layers are attached to a thermally conductive heat sink base containing channels for a coolant liquid and chambers that can be evacuated or filled with a gas, such as helium.

In the Logan device, the wafer is heated by providing energy to the resistive heating element and evacuating the chambers in the base to insulate the wafer from the heat sinking base. Alternatively, the wafer can be cooled by turning off the heating element and filling the chambers in the heat sink base with a heat conductive gas, such as helium, to communicate thermally with the next layer of the assembly.

The Logan device is capable of temperature cycling, but the heating and cooling functions do not act together to maintain the wafer at a desired temperature. In addition, the stacked composite assembly is complex to manufacture and is susceptible to polarization of the boron nitride dielectric layer interposed between the wafer and the electrodes. This can lead to variations and even loss of control in chucking and de-chucking of substrates. The Logan device is also not suited for high bias power applications where large heat fluxes must be removed to prevent thermal runaway of the wafer because their temperature cooling chambers inhibit good thermal communication with the heat sinking base.

Nozawa (U.S. Pat. No. 5,221,403) discloses a monopolar ESC device with a temperature controlled base member and a detachable second member to support the wafer. The base member contains channels for a circulating liquid held at a predetermined temperature. A thermally conductive gas provides heat conduction between the first and second members by filling the minimal space between the layers. In the '403 patent, the purpose of the thermally conductive gas is to maintain the wafer and the base member at the same temperature, the temperature being predetermined by the choice of cooling liquid temperature. The range of temperatures achievable is thus limited to the range of temperatures of the liquid used. Further, the Nozawa design is not well suited for high temperature/high bias applications because in order to reach high chuck temperatures (i.e., around 100–400° C.), a high temperature circulating fluid is necessary which may result in safety hazards or clean room incompatibilities. More importantly, the high temperature of the circulating liquid limits the amount of heat which can be removed from the ESC during processing which can lead to thermal runaway.

None of the ESCs currently available is able to provide adequate temperature control for wafers during plasma-based processing. A device is needed that can maintain a wafer at a predetermined elevated processing temperature. Both the heating and the cooling functions must be controllable to provide a wide range of accessible temperatures at which a wafer can be held with precision.

SUMMARY OF THE INVENTION

In general, it is an object of the invention to provide an ESC with improved temperature control.

Another object is to provide an ESC with both active heating control and active cooling control.

Another object is to provide an actively temperature controlled ESC with feedback control to maintain a predetermined temperature.

In accordance with the above objects and others that will be mentioned and will become apparent below, the present invention relates to a monopolar electrostatic chuck for electrostatically holding an object, such as a semiconducting wafer. The chuck includes an electrode cap and a lower electrode; the cap and the lower electrode being separable from one another. A first channel passing through the electrode cap aligns with a corresponding third channel which passes entirely through the lower electrode. The first and third channels form a conduit to convey a heat conducting gas through the lower electrode and the electrode can to the back side of the wafer. A second channel formed in the electrode cap, but not passing therethrough, aligns with a fourth channel which passes entirely through the lower electrode. The second and fourth channels form a conduit to convey a circulating coolant to the electrode cap. The chuck is further provided with a heating means in the lower electrode, and a control means to regulate the temperature of the chuck by controlling the heating means and the flow of circulating coolant.

In general, the electrode cap may be composed of a metallic electrode coated with a suitable insulator, such as aluminum with a hard anodized coating. The insulator coating could be any other suitable insulator medium such as alumina (with an anodization layer thickness of about 0.002 inches) or aluminum nitride or other ceramic material. The cap may also be a metallic plate coated with a ceramic such as aluminum nitride that is disposed on it through deposition, spray, bonding or other similar process. The cap may also be made of diamond coated molybdenum or ceramic bonded to a metallic plate. Specifically, the electrode cap may be composed of molybdenum with a diamond coating about 5–50 gm thick.

In alternative embodiments, the electrode cap can comprise two pieces, a cap top and a cap bottom, to facilitate changing damaged ESC surfaces and to reduce machining costs. In general, the electrode cap top may be composed of a metallic electrode coated with a suitable insulator, such as aluminum with a hard anodized coating. The insulator coating could be any other suitable insulator medium such as alumina or aluminum nitride or other ceramic material. The cap top may also be a metallic plate coated with a ceramic such as aluminum nitride that is disposed on it through deposition, spray, bonding or other similar process. The cap top may also be made of diamond coated molybdenum or ceramic bonded to a metallic plate, and can be attached to the cap bottom with threaded fasteners and O-ring sealed. A heat conductive gas, such as helium, can be introduced between the cap top and cap bottom to improve thermal communication between the layers.

BRIEF DESCRIPTION OF THE DRAWINGS

For a further understanding of the objects and advantages of the present invention, reference should be had to the following detailed description, taken in conjunction with the accompanying figures, wherein.

DETAILED DESCRIPTION OF THE PREFERRED EMBODIMENTS

The embodiments of this invention are explained with reference to FIGS. 1–4.

Figure 1:
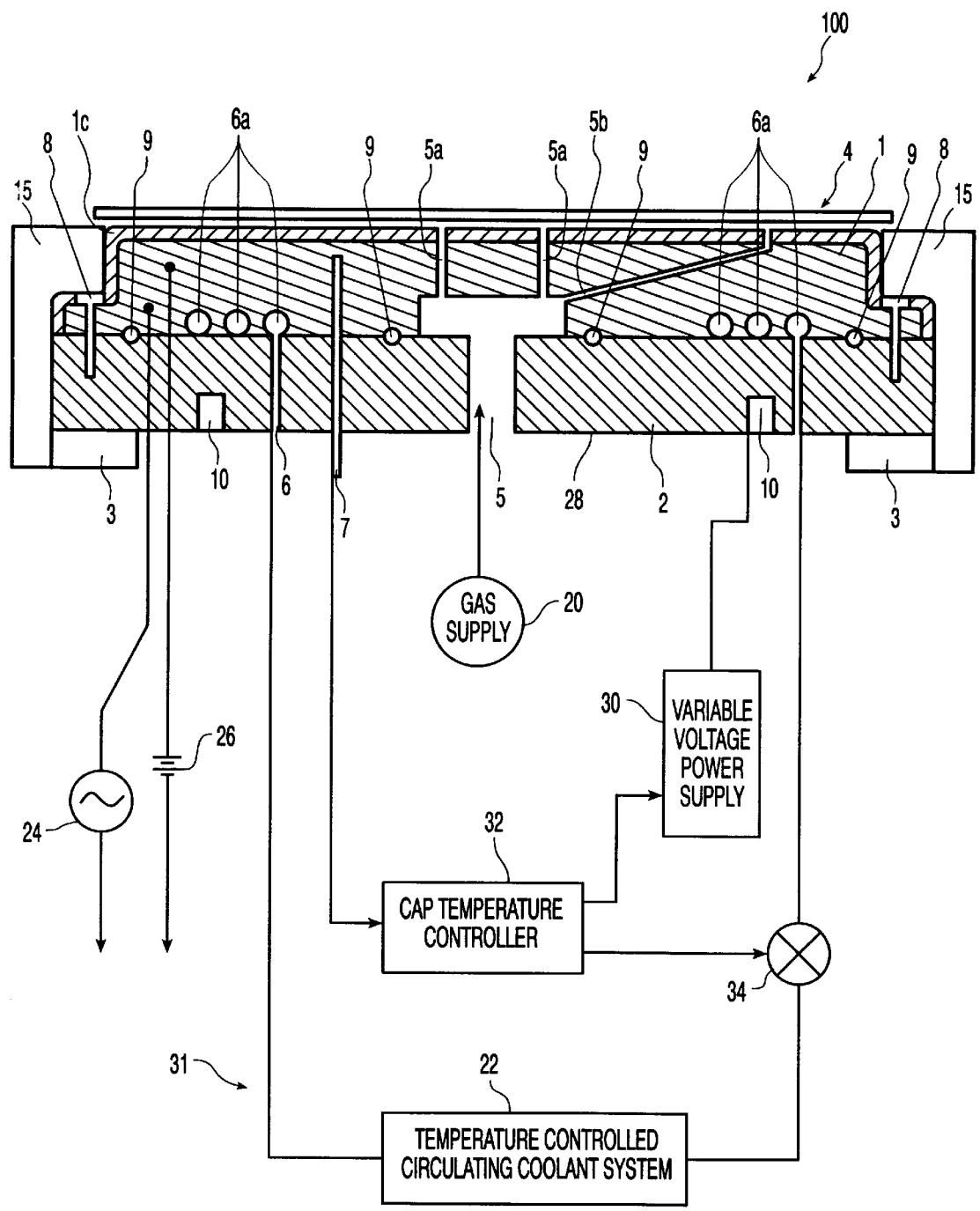
FIG. 1 is a schematic cross section of an electrostatic chuck in accordance with an embodiment of this invention.

FIG. 1 is a schematic cross section of an ESC 100 according to the present invention. The body of the ESC includes an electrode cap 1 and a lower electrode 2. The lower electrode 2 can be composed of, for example, anodized aluminum. The top surface of the lower electrode 2 is in contact with the bottom surface of the electrode cap 1. The electrode cap 1 and lower electrode 2 assembly is disposed on top of an electrically and thermally insulating ring 3 to insulate the ESC from the processing chamber. The ceramic ring 3 can be composed of, for example, $Al_2O_3$.

In general, the electrode cap 1 may be composed of a metallic electrode coated with a suitable insulator, such as aluminum with a hard anodized coating. The insulator coating could be any other suitable insulator medium such as alumina or aluminum nitride or other ceramic material. For example, the electrode cap 1 may be an aluminum metal electrode with an anodized aluminum ($Al_2O_3$) insulating layer. An aluminum alloy such as 6061-T6 or 5052-H32 may be suitably employed. The anodization coating on the top surface of electrode cap 1 provides a dielectric layer 1c, which may have a thickness of 0.001–0.005 inches. The coating should be sealed, non-porous, and provide an electrical voltage breakdown strength of at least 500 volts/mil (1 mil =0.001 inch). The smoothness and flatness finish of the top surface (the clamping or chucking surface) of the dielectric layer 1c should be less than about 20 micro-inches and 0.001 inches, respectively. Alternatively, the electrode cap 1 is composed of molybdenum, and the dielectric layer 1c of the cap is a diamond film with a thickness of about 5–50 $\mu$m.

The corners of the electrode cap 1 should be radiused (i.e., the upper corners of the edge are rounded; see FIG. 1) to about 0.02–0.10", preferably 0.02–0.06", to minimize stress concentrations in the dielectric layer 1c and to prevent enhancement of the electric field by a sharp corner. The article 4 to be chucked, such as a semiconductor wafer with front and back surfaces, is disposed on the chucking surface 1c with the back surface of the wafer 4 in contact with the top surface of the chucking surface 1c. The radius of the chucking surface 1c should be less than the wafer radius by a few millimeters to prevent exposure of the chucking surface to the plasma.

Threaded mechanical fasteners 8 remunerable attach the electrode cap 1 to the lower electrode 2. A lip portion of the electrode cap 1 containing the mechanical fasteners 8 extends beyond the edge of the chucking surface 1c as shown in FIG. 1, and must be protected from exposure to the plasma on the front side of the wafer 4 during processing. This protection can be achieved by positioning a protective ring 15 on the lip portion of electrode cap 1, as shown in FIG. 1. The protective ring 15 can be composed of a ceramic, such as $Al_2O_3$. In a preferred embodiment, O-ring seals 9 may be provided to minimize leakage of the coolant gas through the interface between the electrode cap and the lower electrode.

Channels 5, 5a and 5b are provided to supply a path for a heat conductive gas 20 such as helium, argon or the like to the backside of the wafer 4 to facilitate wafer cooling. The heat conductive gas flows through the central channel 5 and into the channels 5a and 5b that extend through the dielectric layer 1c to the back surface of the wafer 4. Hence, the conductive gas is introduced through the channels and presented at the backside of the wafer. Two channels 5a are shown in the cross-section of FIG. 1, but typically 4 to 8 channels are used. Likewise, only one channel 5b is shown for simplicity, but typically 4–8 or more channels 5b are used. The heat conductive coolant gas will fill the minimal space between the top of the chucking surface 1c and the backside of the wafer 4. Grooves (not shown) may also be provided on the chucking surface 1c to facilitate uniform distribute of gas to improve heat transfer.

Channels 6 and 6a are provided to supply a path for a circulating liquid for actively cooling the electrode cap 1. The coolant liquid can be water or any suitable liquid, for example, ethylene glycol, silicon oil, fluorinert (liquid teflon) or a water/glycol mixture. The cooling rate can be controlled by using different coolant liquids, by varying the flow rate of the coolant, or by varying the initial temperature of the coolant 22. The coolant temperature may range from 20–250° C., As shown in FIG. 1, channels 5 and 6 pass entirely though the lower electrode 2 but preferably from 20–150° C., and more preferably 20–100° C.

Electrical connections 24 provide RF power to both the electrode cap 1 and the lower electrode 2 during wafer processing. The RF power is typically about 0–3000 W with a DC bias of <–1000 V. Another set of electrical connections 26 provides a clamping voltage about 150 to 500 V, preferably about 300 V, more negative than the average DC bias voltage, to both the electrode cap 1 and the lower electrode 2.

A temperature sensor 7 actively monitors the temperature of the electrode cap 1. The temperature sensor can be, for example, a thermocouple placed in thermal contact with the electrode cap 1. One or more resistive cartridge electrical heaters 10 are mounted in the lower electrode 2 on a bottom surface thereof to heat the electrode to a temperature of about 100–350° C. The heaters have a power of about 100–400 W each. For the anodized aluminum cap, the cap temperature is typically maintained at $\leq 200°$ C. (usually 100–150° C) to prevent cracking of the anodization due to differing thermal expansion coefficients for the anodized layer and base material. For the diamond or ceramic coated design, the cap temperature can be higher, but is typically <350° C. In a preferred embodiment, two cartridge heaters may be operated in an on/off mode and the coolant liquid, fluorinert, may be circulated using a fixed flow rate and also operating in an on/off mode.

To maintain a desired wafer temperature, a circulating coolant flows through the channels 6a in the electrode cap 1 to cool the ESC, and power is provided to the resistive heaters 10 to heat the ESC. The circulating coolant flow can be turned off while the heaters are on for heating the ESC, and turned on while the heaters are off for cooling the ESC. Alternatively, the circulating coolant can flow continuously. Through a feedback control loop, the heater input and circulating coolant flow are adjusted so As shown in FIG. 1, the heaters 10 are mounted in the lower electrode 2, at least a portion of the heaters being situated, in a vertical direction, below where circulating coolant enters the electrode cap 1 that the chuck is maintained at the desired temperature.

The feedback control system 31 makes use of real time temperature measurement of the electrode cap 1 to determine the required coolant flow and heater input to maintain the electrode cap at the desired temperature. For example, a commercially available temperature controller 32 can read the temperature sensor 7. The temperature controller can operate a solenoid switch 34 to direct the flow of coolant liquid to the channels in the ESC, and can switch off the power to the heating elements, when the temperature of the chuck is higher than a predetermined temperature. When the wafer temperature is lower than a predetermined temperature, the temperature controller can operate a solenoid switch to divert the flow of coolant liquid to a pathway bypassing the ESC, and can switch on the power to the heating elements. Alternatively, the temperature controller can operate an electronic flow controller to reduce or increase the flow rate of coolant liquid and thus vary the cooling rate. The temperature controller can also operate a variable power supply 30 to increase or decrease the input power to the heating elements to reduce or increase the heating rate.

For a given processing condition (e.g., pressure, source power, bias power etc..), one can select the appropriate ESC temperature and backside pressure to reach and maintain the desired wafer temperature. As an example, for high density plasma dielectric gap fill deposition of $SiO_2$, one may desire a wafer temperature of around 375° C. With this ESC design, following an initial transient (around 30 seconds), one can maintain the desired wafer temperature of around 375° C. indefinitely at 2000 W bias power, as determined by a fluoroptic temperature probe (Luxtron™). The representative ESC parameters corresponding to this example are as follows: Two 400 W cartridge heaters; 55° C., 50/50 glycol/water liquid coolant at 0.6 gal/min flow; 2 Torr backside helium pressure; electrode cap temperature of 120° C, – 300 V clamping voltage; 2500 W source power and 2000 W bias power. For lower bias powers to achieve the same wafer temperature, one might use a higher ESC temperature. To obtain lower wafer temperatures, one might increase the helium pressure or reduce the electrode cap temperature.

Figure 2:
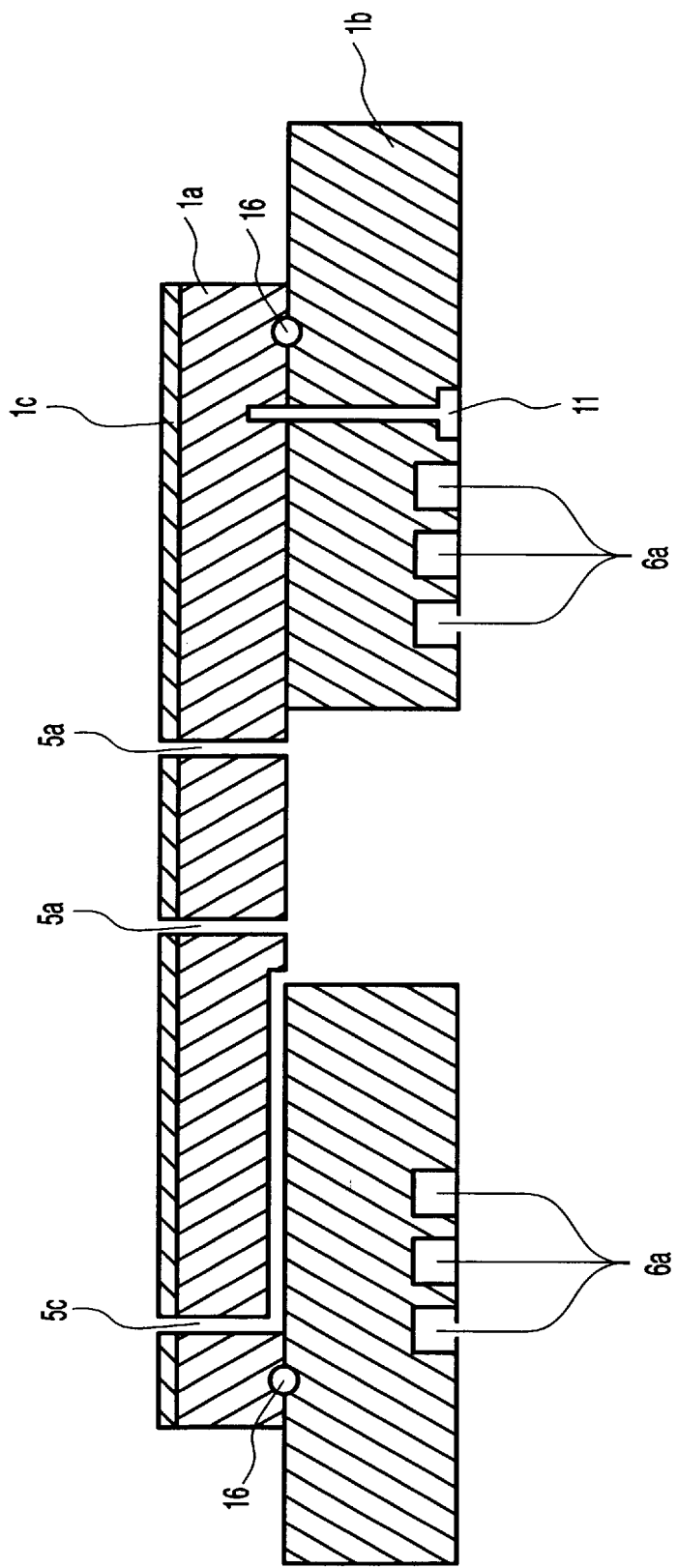
FIG. 2 is a schematic cross section of a two (or three) piece electrode cap in accordance with another embodiment of this invention.

In an alternative embodiment, the electrode cap can comprise two pieces. FIG. 2 is a schematic cross section of a two-piece electrode cap with a cap top 1a and a cap bottom 1b. The use of a two piece electrode cap facilitates changing damaged ESC surfaces and reduces machining costs. In general, the electrode cap top 1a may be composed of a metallic electrode coated with a suitable insulator, such as aluminum with a hard anodized coating. The insulator coating could be any other suitable insulator medium such as alumina or aluminum nitride or other ceramic material. The cap top 1a may also be a metallic plate coated with a ceramic such as aluminum nitride that is disposed on it through deposition, spray, bonding or other similar process. The cap top 1a may also be made of diamond-coated molybdenum, or a ceramic, such as aluminum nitride, bonded to a metallic plate. (An electrode cap comprising a cap top and a cap bottom, wherein the cap top is a ceramic bonded to a metallic plate, could be considered a three piece electrode cap. For simplicity, however, it will henceforth be referred to as a two piece cap.) The cap top 1a is attached to the cap bottom 1b with threaded fasteners 11 and vacuum sealed with an O-ring 16 (such as a Kalrez™ O-ring) suitable for high temperature use. For simplicity, only one fastener 11 is shown in the cross-sectional diagram of FIG. 2, but typically 4 or more fasteners are used.

A heat conductive cooling gas, such as helium, is delivered to the clamping surface 1c by means of channels 5a and 5c. Typically four to eight channels 5a are used. Channel 5c can be machined in either the cap top 1a or the cap bottom 1b. Although only one channel 5c is shown in FIG. 2, four to eight channels are typically used. Additionally, grooves (not shown) can be provided on the top surface of the dielectric layer 1a to facilitate coolant gas distribution, as discussed in connection with FIG. 1.

The mechanical clamping of the cap top to the cap bottom creates adequate thermal communication between the cap components, but it can be improved by introducing a heat conductive gas, such as helium, between the upper surface of the cap bottom 1b and the lower surface of the cap top 1a. For simplicity, the same helium supply used for wafer cooling can also be used to supply helium between the cap components 1a and 1b or, alternatively, a separate supply can be used if a different gas pressure is desired.

The two piece electrode cap in FIG. 2 may additionally incorporate the other elements of the electrode cap described in reference to FIG. 1, such as cooling channels, temperature sensor, and the like. For simplicity, these additional features are not shown in FIG. 2. The active temperature control described above in reference to FIG. 1 is used with the electrode cap of FIG. 2 in the same manner.

Figure 3:
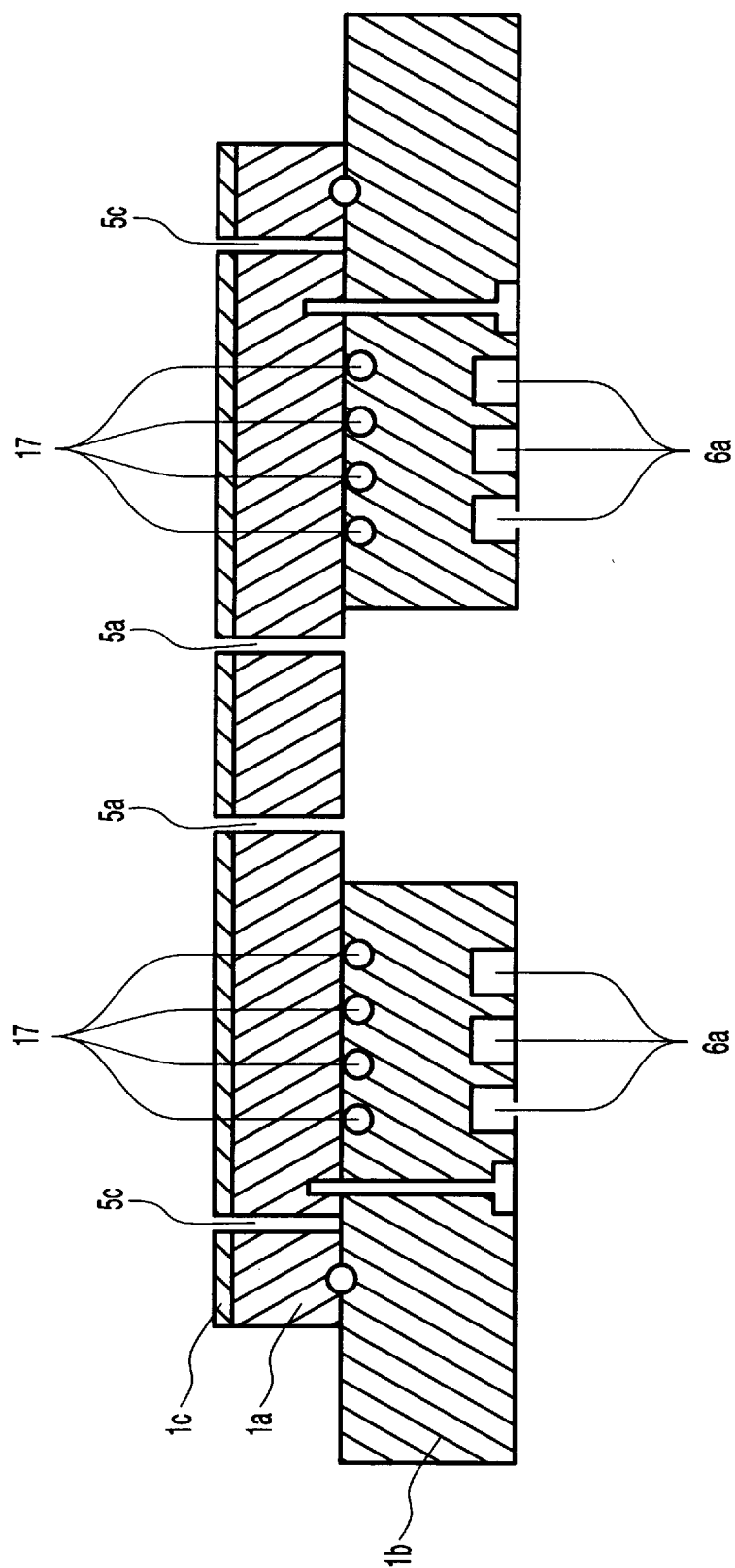
FIG. 3 is a schematic cross section of a two or three piece electrode cap with an embedded spiral cable heater in accordance with a further embodiment of this invention.
Figure 4:
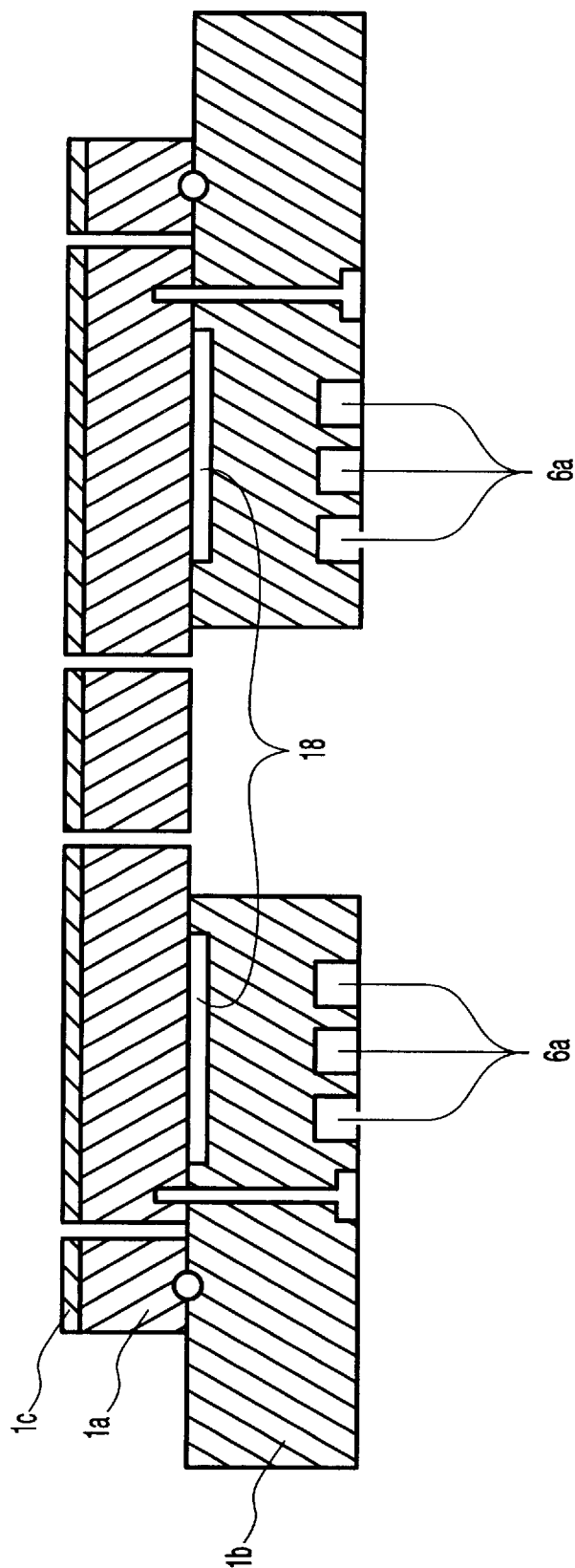
FIG. 4 is a schematic cross section of a two or three piece electrode cap with an embedded annular strip heater in accordance with a further embodiment of this invention.

FIGS. 3 and 4 show additional embodiments of this invention. In FIG. 3, a two or three piece electrode cap is shown. The caps in FIGS. 3 and 4 include a distributed resistive heater attached to the upper surface of the electrode cap bottom 1b. These heaters may be placed in the electrode cap top 1a or in the electrode cap bottom 1b. The resistive heater may be a spirally wound cable heater 17 as shown in FIG. 3, for example, or a thin annular strip or mica foil heater 18 as shown in FIG. 4. The cable heater 17, for example a nichrome wire heater, is preferred because it allows a relatively large interface surface between the cap top 1a and cap bottom 1b resulting in improved thermal communication. For example, the heater may be 1/16 inch in diameter and 65 inches long, with a stainless steel sheath, providing around 500 W at 120 V. The cable can be inserted in a spiral machined into the cap bottom 1b and pressed into place to yield a flush upper surface on the cap bottom 1b. Preferably, the cable heater would be embedded within the mold of a cast cap bottom.

Alternatively, the mica foil heaters 18 in FIG. 4 are composed of an etched foil encapsulated by mica insulation on all sides. These mica foil heaters are typically less than 1 mm thick and can easily provide as much as 100 W/in$^2$ when operating at 260° C. Alternatively, these mica heaters can be enclosed in a steel sheath (typically less than 5 mm thick) and provide up to 50 W/in$^2$ power densities. Other annular heaters could also be used, for example, boron nitride heaters.

The embodiments described in FIGS. 3 and 4 may additionally incorporate the other elements of the electrode cap described in reference to FIGS. 1 and 2, such as cooling channels, temperature sensor, and the like. For simplicity, these additional features are not shown in FIGS. 3 and 4. In addition, the lower electrode 2 in FIG. 1, when used with the electrode caps of FIGS. 3 or 4, may not contain the resistive cartridge heaters 10. The active temperature control achieved through the use of feedback control described above in reference to FIG. 1 is used with the electrode cap of FIGS. 3 and 4 in the same manner, except that the heating voltage may be supplied to the cable or foil heating elements instead of, or in addition to, to the resistive cartridge heating elements 10.

While the foregoing detailed description has described several embodiments of the electrostatic chuck with active temperature control in accordance with this invention, it is to be understood that the above description is illustrative only and is not intended to limit the disclosed invention. It will be appreciated that other various changes may be made without departing from the spirit and scope of the present invention, as defined by the claims.

What is claimed is:

1. An electrostatic chuck for electrostatically attracting and holding an object with front and back surfaces, comprising:

an electrode cap with top and bottom surfaces, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap;

heating means for heating said electrostatic chuck mounted in said lower electrode, at least a portion of the heating means being situated, in a vertical direction, below where said circulating coolant enters said electrode cap; and feedback control to maintain said chuck at a predetermined temperature.

2. An electrostatic chuck as set forth in claim 1 further comprising DC bias means for biasing said electrostatic chuck to provide an electrostatic clamping voltage and RF bias means for applying bias power to said object.

3. An electrostatic chuck as set forth in claim 1 wherein said feedback control includes a means to control the heating means and a means to control the circulating coolant liquid means.

4. An electrostatic chuck as set forth in claim 3 wherein the means to control the heating means includes a variable voltage power supply provided to the heating means, whereby the amount of power provided to the heating means can be controlled.

5. An electrostatic chuck as set forth in claim 3 wherein the means to control the circulating liquid means includes a liquid flow controller whereby the rate of flow of said circulating liquid through the electrode cap can be controlled.

6. An electrostatic chuck as set forth in claim 1 wherein the heating means is a multiplicity of resistive cylindrical cartridge heaters.

7. An electrostatic chuck as set forth in claim 1 wherein the heating means is a resistive cable heater.

8. An electrostatic chuck as set forth in claim 1 wherein the heating means is an annular strip heater.

9. An electrostatic chuck as set forth in claim 1 wherein the electrode cap is composed of aluminum and the top surface of the electrode cap is provided with a dielectric layer composed of aluminum oxide.

10. An electrostatic chuck as set forth in claim 1 wherein the electrode cap is composed of molybdenum and the top surface of the electrode cap is provided with a dielectric layer composed of diamond.

11. An electrostatic chuck as set forth in claim 10 wherein the thickness of the diamond dielectric layer is approximately 5–50 μm.

12. An electrostatic chuck as set forth in claim 1 wherein the electrode cap is metallic and the top surface of the electrode cap is provided with a dielectric layer composed of a ceramic.

13. An electrostatic chuck as set forth in claim 12 wherein the ceramic is aluminum nitride.

14. An electrostatic chuck as set forth in claim 1 wherein the heat conductive gas is helium, argon, nitrogen or oxygen.

15. An electrostatic chuck as set forth in claim 1 wherein the circulating liquid coolant is deionized water, ethylene glycol, fluorinert, silicon oil or a mixture of deionized water and ethylene glycol.

16. An electrostatic chuck in accordance with claim 1, wherein the object is a semiconductor wafer.

17. An electrostatic chuck for electrostatically attracting and holding an object with front and back surfaces, comprising:

an electrode cap with top and bottom surfaces, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap;

a multiplicity of resistive cartridge heaters mounted in said lower electrode, at least a portion of the heaters being situated, in a vertical direction, below where said circulating coolant enters said electrode cap; and feedback control to maintain said chuck at a predetermined temperature, said feedback control including a means to control the heating means and a means to control the circulating coolant liquid means, said means to control the heating means including a power supply provided to the heating means, whereby the power provided to the heating means can be turned on or off, said means to control the circulating liquid means including a solenoid activated valve whereby the flow of said circulating liquid through the electrode cap can be regulated from normal flow to trickle or no flow.

18. An electrostatic chuck as set forth in claim 17 wherein the electrode cap is composed of aluminum and the top surface of the electrode cap is provided with a dielectric layer is composed of aluminum oxide.

19. An electrostatic chuck as set forth in claim 17 wherein the electrode cap is composed of molybdenum and the top surface of the electrode cap is provided with a dielectric layer composed of diamond, said dielectric layer having a thickness of approximately 5–50 μm.

20. An electrostatic chuck in accordance with claim 17, wherein the object is a semiconductor wafer.

21. An electrostatic chuck for electrostatically attracting and holding an object with front and back surfaces, comprising:

an electrode cap including a cap top with top and bottom surfaces, and a cap bottom with top and bottom surfaces, said top surface of said cap bottom being fastened to said bottom surface of said cap top, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap; and heating means for heating said electrostatic chuck mounted in said lower electrode, at least a portion of said heating means being situated, in a vertical direction, below where said circulating coolant enters said electrode cap.

22. An electrostatic chuck as set forth in claim 21 further comprising DC bias means for biasing said electrostatic chuck to provide an electrostatic clamping voltage and RF bias means for applying bias power to said object.

23. An electrostatic chuck as set forth in claim 21 further comprising feedback control to maintain said chuck at a predetermined temperature.

24. An electrostatic chuck as set forth in claim 23 wherein said feedback control includes a means to control the heating means and a means to control the circulating coolant liquid means.

25. An electrostatic chuck as set forth in claim 24 wherein the means to control the heating means includes a variable voltage power supply provided to the heating means, whereby the amount of power provided to the heating means can be controlled.

26. An electrostatic chuck as set forth in claim 24 wherein the means to control the circulating liquid means includes a liquid flow controller whereby the rate of flow of said circulating liquid through the electrode cap can be controlled.

27. An electrostatic chuck as set forth in claim 21 wherein the heating means is a multiplicity of resistive cylindrical cartridge heaters.

28. An electrostatic chuck as set forth in claim 21 wherein the heating means is a resistive cable heater.

29. An electrostatic chuck as set forth in claim 21 wherein the heating means is an annular strip heater.

30. An electrostatic chuck as set forth in claim 21 wherein the cap top is composed of aluminum and the top surface of the electrode cap is provided with a dielectric layer composed of aluminum oxide.

31. An electrostatic chuck as set forth in claim 21 wherein the cap top is composed of molybdenum and the top surface of the electrode cap is provided with a dielectric layer composed of diamond.

32. An electrostatic chuck as set forth in claim 31 wherein the thickness of the diamond dielectric layer is approximately 5-50 Am.

33. An electrostatic chuck as set forth in claim 21 wherein the cap top is metallic and the top surface of the electrode cap is provided with a dielectric layer composed of a ceramic.

34. An electrostatic chuck as set forth in claim 33 wherein the ceramic is aluminum nitride.

35. An electrostatic chuck as set forth in claim 21 wherein the heat conductive gas is helium, argon, nitrogen or oxygen.

36. An electrostatic chuck as set forth in claim 21 wherein the circulating liquid coolant is deionized water, ethylene glycol, fluorinert, silicon oil or a mixture of deionized water and ethylene glycol.

37. An electrostatic chuck in accordance with claim 21, wherein the object is a semiconductor wafer.

38. An electrostatic chuck for electrostatically attracting and holding an object with front and back surfaces, comprising:

an electrode cap including a cap top with top and bottom surfaces, and a cap bottom with top and bottom surfaces, said top surface of said cap bottom being fastened to said bottom surface of said cap top, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap;

a multiplicity of resistive cartridge heaters mounted in said lower electrode, at least a portion of the heaters being situated, in a vertical direction, below where said circulating coolant enters said electrode cap; and feedback control to maintain said chuck at a predetermined temperature, said feedback control including a means to control the heating means and a means to control the circulating coolant liquid means, said means to control the heating means including a power supply provided to the heating means, whereby the power provided to the heating means can be turned on or off, said means to control the circulating liquid means including a solenoid activated valve whereby the flow of said circulating liquid through the electrode cap can be regulated from normal flow to trickle or no flow.

39. An electrostatic chuck as set forth in claim 38 wherein the cap top is composed of aluminum and the top surface of the electrode cap is provided with a dielectric layer composed of aluminum oxide.

40. An electrostatic chuck as set forth in claim 38 wherein the cap top is composed of molybdenum and the top surface of the electrode cap is provided with a dielectric layer composed of diamond, said dielectric layer having a thickness of approximately 5–50 $\mu m$.

41. An electrostatic chuck as set forth in claim 38 wherein the cap top is metallic and the top surface of the electrode cap is provided with a dielectric layer composed of aluminum nitride.

42. An electrostatic chuck in accordance with claim 38, wherein the object is a semiconductor wafer.

43. An electrostatic chuck for electrostatically attracting and holding an object with front and back surfaces, comprising:

an electrode cap with top and bottom surfaces, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap;

heating means for heating said electrostatic chuck, said heating means being mounted on a bottom surface of said lower electrode;

a temperature sensor arranged to measure a temperature of said electrode cap; and feedback control to maintain said chuck at a predetermined temperature, said feedback control including a means to control the heating means and a means to control a flow of said circulating liquid through the electrode cap.

44. An electrostatic chuck in accordance with claim 43, wherein said heating means comprises a multiplicity of resistive cartridge heaters.

45. An electrostatic chuck in accordance with claim 43, wherein the object is a semiconductor wafer.

46. A method for controlling a temperature of an object during plasma processing, said object having a front and a back surface, said method comprising the steps of:

providing an electrostatic chuck comprising:

an electrode cap with top and bottom surfaces, said electrode cap being provided with a first channel means and a second channel means;

a lower electrode with top and bottom surfaces, said top surface of said lower electrode being fastened to said bottom surface of said electrode cap, said lower electrode being provided with a third channel means and a fourth channel means, said third and fourth channel means passing entirely through said lower electrode and connecting said lower electrode bottom surface with said lower electrode top surface, wherein said third channel means of said lower electrode and said first channel means of said electrode cap form a conduit to convey a heat conductive gas from said bottom surface of said lower electrode to said back surface of said object, and wherein said second channel means of said electrode cap and said fourth channel means of said lower electrode form a conduit to convey a circulating coolant liquid from said bottom surface of said lower electrode to said electrode cap;

heating means for heating said electrostatic chuck; and a temperature sensor arranged to detect a measured temperature of said electrode cap, wherein said object is positioned atop said electrode cap;

turning on said heating means and turning off said circulating coolant to heat said electrostatic chuck, whenever the measured temperature of the cap is below a predetermined range, and turning off said heating means and turning on said circulating coolant to cool said electrostatic chuck, whenever the measured temperature of the cap is above said predetermined range.

47. The method of claim 46, wherein said circulating coolant is maintained at a temperature between 20–100° C.

48. The method of claim 46, wherein said predetermined range of the cap temperature is within the range of 100–350° C.

49. The method of claim 48, wherein a temperature of the object is maintained at about 375° C.

50. The method of claim 46, wherein a temperature of the object is maintained at about 375° C.

51. The method of claim 46, wherein the object is a semiconductor wafer.

* * * * *